United States Patent [19]
Schmidt

[11] 3,801,384
[45] Apr. 2, 1974

[54] FABRICATION OF SEMICONDUCTOR DEVICES

[75] Inventor: John G. Schmidt, St. Louis, Mo.

[73] Assignee: Monsanto Company, St. Louis, Mo.

[22] Filed: Dec. 8, 1972

[21] Appl. No.: 313,206

Related U.S. Application Data

[62] Division of Ser. No. 134,251, April 15, 1971, Pat. No. 3,728,785.

[52] U.S. Cl. ................. 148/188, 148/186, 148/187, 29/588

[51] Int. Cl. ............................................. H01l 7/34

[58] Field of Search ...... 148/188, 189; 29/588, 580, 29/578

[56] References Cited

UNITED STATES PATENTS

| | | | |
|---|---|---|---|
| 3,352,725 | 11/1967 | Antell | 148/188 X |
| 3,437,533 | 4/1969 | Dingwall | 148/187 |
| 3,484,854 | 12/1969 | Wolley | 148/187 |
| 3,502,518 | 3/1970 | Antell | 148/186 |
| 3,541,676 | 11/1970 | Brown | 29/571 |
| 3,617,820 | 11/1971 | Herzog | 317/235 R |

*Primary Examiner*—G. T. Ozaki
*Attorney, Agent, or Firm*—Peter S. Gilster

[57] ABSTRACT

The disclosure herein pertains to methods for fabricating discrete semiconductor devices, particularly light-emitting diodes. The disclosure more particularly concerns a diffusion process to form controlled regions of P-type conductivity in N-type conductivity semiconductors.

5 Claims, 11 Drawing Figures

FABRICATION OF SEMICONDUCTOR DEVICES

This is a division, of application Ser. No. 134,251, filed April 15, 1971, now U.S. Pat. No. 3,728,785.

BACKGROUND OF THE INVENTION

This invention pertains to the field of semiconductor devices, particularly light-emitting devices, and fabrication methods therefor.

As pertains to one aspect of this invention, the prior art describes numerous methods for fabricating semiconductor devices wherein conventional photolithographic techniques are used in conjunction with various masking, impurity diffusion and etching systems to provide one or more regions of one conductivity type in semiconductor bodies of another conductivity type. By variation of these techniques simple or complex semiconductor components may be fabricated to produce a variety of electronic devices, including light-emitting devices.

Among the various diffusion systems described in the prior art are vapor phase, solid phase and liquid phase diffusions of the conductivity-type determining impurity into the masked or unmasked semiconductor substrate body to provide active regions therein. Some of the diffusions described in the prior art must be conducted in evacuated and sealed ampoules (closed tube diffusion), while other may be performed as an open-tube diffusion.

With respect to various diffusion masking systems, it is known to use a layer of $SiO_2$ or impurity-doped $SiO_2$ through which, or through windows of which, certain impurities may be diffused into the semiconductor wafer or to use an impurity-doped Si or $SiO_2$ layer from which the impurity is diffused into the semiconductor substrate. See, e.g., U.S. Pat. Nos. 3,255,056, 3,352,725, 3,450,581, 3,502,517, 3,502,518 and 3,530,015. It is also known to use diffusion masks of silicon nitride which may be further coated with silicon (U.S. Pat. No. 3,537,921) or metals (U.S. Pat. No. 3,519,504) which are deposited in direct contact with a surface of the semiconductor body. Another masking/diffusion system involves masks having separate, distinct portions consisting, respectively, of various oxides, e.g., $SiO_2$, and laminated $Si_3N_4/SiO_2$ or $SiO_2/Si_3N_4/SiO_2$; this latter type of combination mask has been described (U.S. Pat. No. 3,484,313) in connection with a selective diffusion process for diffusing a plurality of different types of impurities into different regions of a semiconductor body, each portion of the mask being effective to block or partially block specified impurities; the system is said to be suitable for gas phase, solid phase or liquid phase diffusions.

Problems commonly encountered in most prior art diffusion systems include poor control and reproducibility of the impurity surface concentration, diffusion profile, junction depth and planarity of the P-N junction. Still other problems relate to masking systems used; for example, lack of adhesion of the mask to the semiconductor surface; permeability of the mask to the in-diffusing impurity and/or out-diffusion of volatile constituents or desired impurities in intermetallic or elemental semiconductors, thus requiring very thick or heavily-doped masking layers; and reactivity of the masking material with the impurity and/or semiconductor body and necessity to use a closed-tube diffusion with some masking systems.

Therefore, it is an object of the present invention to provide a unique diffusion system for fabricating semiconductor devices.

More particularly, it is an object of this invention to provide a solid-solid open-tube diffusion process which overcomes the above-mentioned problems associated with diffused semiconductor devices.

Still more particularly, it is an object of the present invention to provide a diffusion system which is controllable, simple and economical.

These and other objects will become apparent from the detailed description given below.

SUMMARY OF THE INVENTION

This invention relates to a unique impurity diffusion system to fabricate semiconductor devices; in preferred embodiments, full chip emitter discrete light-emitting diodes (LED's) are provided from III-V compounds or mixtures thereof.

The semiconductor device fabrication process herein comprises the use of an impurity diffusion system consisting of a $SiO_2/ZnO/SiO_2$ sandwich-structure diffusant source, which is in intimate contact with the semiconductor body of N-type conductivity, to provide a means of controllably diffusing zinc into the full surface thereof. Upon heating the structure, zinc is diffused from the diffusant source to form a region of P-type conductivity in the N-type semiconductor substrate body. When the semiconductor component is an arsenide of the Group III element, the component, having protective layers of $SiO_2$ thereon, is heat-treated to anneal the interface between the diffusion surface of the component and the $SiO_2$ layer in contact therewith and simultaneously densify the latter forming a diffusion modulation layer.

DESCRIPTION OF PREFERRED EMBODIMENTS

The present invention in its preferred embodiments relates to a method for fabricating full chip emitter discrete light-emitting diodes (LED's). Preferred semiconductor materials include gallium arsenide (GaAs), gallium phosphide (GaP) and gallium arsenide phosphide ($GaAs_{1-X}P_X$, where X is a numerical value greater than zero and less than one).

EXAMPLE 1

In a preferred embodiment of this invention, LED's are prepared with gallium phosphide as the semiconductor component of the device.

Figure 1:
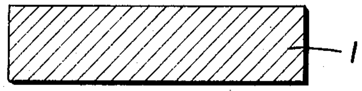
FIGS. 1–6 are cross-sectional schematic views of a semiconductor wafer during successive steps in the fabrication of one embodiment of an LED.
Figure 2:
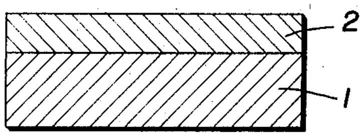
Figure 3:
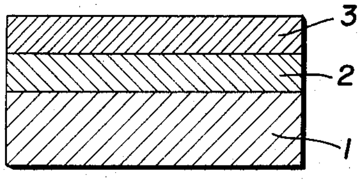
Figure 4:
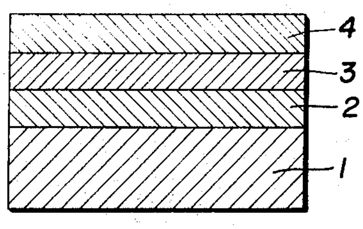

Referring to the drawings, which show successive stages in the fabrication process of this embodiment, FIG. 1 represents a cleaned and polished GaP wafer 1 in cross-section schematic view. The GaP is of N-type conductivity doped with sulfur to a carrier concentration of about $5\times10^{16}$ atoms/cc, or generally within the range of about $3\times10^{16}$ to $1\times10^{17}$ atoms/cc. In FIG. 2, a layer 2 of $SiO_2$ about 500 A thick is deposited on the front (top) surface of the GaP substrate wafer 1; the $SiO_2$ layer may be prepared and deposited by various means known to the art and in this example, by reacting silane ($SiH_4$) with oxygen carried by nitrogen at temperatures of from 300°–400°C to deposit $SiO_2$ on the GaP wafer. A layer 3 of zinc oxide (ZnO) about 350 A thick is then deposited on $SiO_2$ layer 2 as shown in FIG. 3. The ZnO layer is formed and deposited by reacting diethyl zinc, carried in nitrogen, with oxygen at about 400°C or, generally, within the range of from 300°–500°C. A final layer 4 of $SiO_2$ about 1,000 A thick is then deposited over the ZnO layer as shown in FIG. 4. The $SiO_2$ layer tends to retard out-diffusion of zinc from the ZnO layer. The wafer thus prepared is then transferred to an open tube diffusion furnace and heated to 875°C in forming gas for 30 minutes. Zinc is diffused from the ZnO layer through the $SiO_2$ layer 2 into the substrate wafer to form a graded P region 5 (FIG. 5) approximately 1–2 microns below the surface which has a surface zinc concentration of about $3\times10^{19}$ atoms/cc.

It will be apparent that the diffusion times and temperatures may be varied with a variation of the thicknesses of the ZnO and/or $SiO_2$ layers, zinc concentration and junction depth of the P region and semiconductor substrate material.

Figure 5:
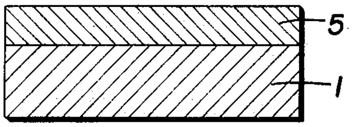
Figure 6:
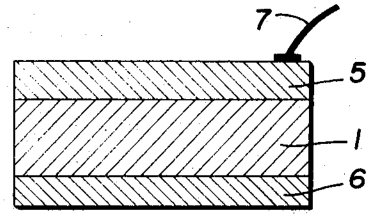

After the diffusion operation the cooled wafer is then treated in aqueous HF or an aqueous mixture of $HF:NH_4F$ for a time, less than a minute, sufficient to etch away the $SiO_2/ZnO/SiO_2$ diffusant layers (2, 3 and 4) shown in FIG. 4 and leave the Zn-diffused P/N structure shown in FIG. 5. The wafer is rinsed with deionized water (DI), then lightly etched in hot (80°C) HCl for about 3 minutes, rinsed again with DI then with isopropyl alcohol (IPA) and dried. The wafer is back lapped to a thickness of 5–6 mils and cleaned.

After the wafer has been cleaned, contacts and leads are attached thereto. Ohmic contact is made to the N surface by vacuum evaporating a Au/Ge alloy (12% Ge) layer 6 onto the back side of the wafer 1. The wafer is then attached N-side down to a post or header (not shown). Contact to the P surface 5 is made by bonding conductive wire, e.g., Au, lead 7 directly to the surface of the GaP wafer; this wire bond may be made by any suitable means such as thermo-compression bonding or ultra-sonic bonding.

The device thus prepared is then encapsulated with an appropriate lens for LED devices, e.g., clear epoxy.

EXAMPLE 2

In another preferred embodiment of this invention, LED's are prepared with gallium arsenide phosphide (abbreviated to GaAsP for compositions in the general formula $GaAs_{1-X}P_X$, where X is greater than zero and less than one as the semiconductor component of the device. The phosphorus content preferably is from 30–50 percent and in this example, the composition is approximately $GaAs_{.60}P_{.40}$.

The GaAsP component for the device to be fabricated may be processed as a wafer of GaAsP or as an epitaxial film thereof grown on a compatible substrate of GaAs. In either case, the fabrication steps will generally be the same as those described above for GaP LED devices, except for the modification noted below, reference being made to FIGS. 1–5 where applicable.

FIG. 1 represents a cleaned and polished GaAsP wafer 1 in cross-section schematic view. The GaAsP is of N-type conductivity doped with tellurium to a carrier concentration of about $5\times10^{16}$ atoms/cc, or generally, within the range of about $1\times10^{16}$–$5\times10^{18}$ atoms/cc. In FIG. 2, a layer of $SiO_2$ (not shown) about 1,000 A thick is deposited on the back (bottom) surface and a layer 2 of $SiO_2$ about 200 A thick is deposited on the front (top) surface of the GaAsP substrate wafer 1; these $SiO_2$ layers may be prepared as described in Example 1. The wafer is now heat treated at about 875°C or, generally, within the range of from 800°–950°C, in forming gas for about 1 hour. This is a highly important step, involving annealing of the $SiO_2$/GaAsP interface as well as forming a densified modulating layer 2 for the subsequent diffusion of zinc therethrough, thus providing further control of the zinc diffusion into the GaAsP wafer. This step in the process is not necessary when the substrate material is GaP.

Following the heat treatment, a layer 3 of zinc oxide (ZnO) about 300 A thick is deposited on layer 2 as shown in FIG. 3. The ZnO layer is formed and deposited by reacting diethyl zinc, carried in nitrogen, with oxygen at about 400°C or, generally, within the range of from 300°–500°C. A final layer 4 of $SiO_2$ about 500 A thick is then deposited over the ZnO layer as shown in FIG. 4. The $SiO_2$ layer tends to retard out-diffusion of zinc from the ZnO layer. The wafer thus prepared is then transferred to an open tube diffusion furnace and heated to 875°C in forming gas for 30 minutes. Zinc is diffused from the ZnO layer through the modulating $SiO_2$ layer 2 into the substrate wafer to form a graded P region 5 (FIG. 5) approximately 6 microns below the surface which has a surface zinc concentration of about $3\times10^{19}$ atoms/cc.

It will be apparent that the diffusion times and temperatures may be varied with a variation of the thicknesses of the ZnO and modulating $SiO_2$ layers, zinc concentration and junction depth of the P region and semiconductor substrate material.

After the diffusion operation the cooled wafer is then treated in aqueous HF or an aqueous mixture of $HF:NH_4F$ for a time, less than a minute, sufficient to etch away the $SiO_2$ layer on the back of the wafer and the $SiO_2/ZnO/SiO_2$ diffusant layers (2, 3 and 4) shown in FIG. 4 and leave the P/N structure shown in FIG. 5. This structure is then cleaned with sequential treatments with hot HCl, DI, isopropyl alcohol (IPA) and dried.

Figure 7:
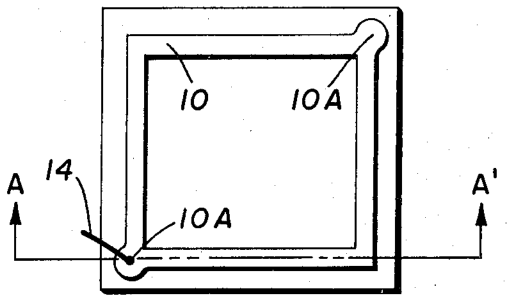
FIG. 7 is a top plan view of another embodiment of an LED fabricated according to this invention.
Figure 8:
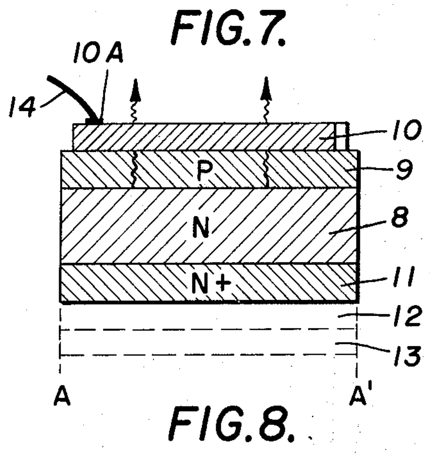
FIG. 8 is a cross-sectional schematic view taken along line A—A' of the completely fabricated LED shown in plan view in FIG. 7.

After the P region is formed, aluminum is then vacuum evaporated to a thickness of 1,000–1,500 A over the front surface (9 in FIG. 8) of the wafer forming the P contact of the GaAsP wafer. Using photomasking and etching, the aluminum metallization pattern 10 is defined on the LED device as shown in FIG. 7; FIG. 8 is a cross-sectional view of the device taken along the line A—A′ of FIG. 7.

After the P-surface contact has been made, ohmic contact is then made to the back (N surface 8 in FIG. 8) by any suitable means. A preferred ohmic contact method is disclosed and claimed in copending application, U.S. Ser. No. 21,637, filed Mar. 23, 1970, now U.S. Pat. No. 3,636,618, and assigned to the assignee of this application. That method involves vacuum evaporating first a layer of tin, then a layer of gold onto the N-surface, heating the wafer to alloy the tin and gold with a surface region of GaAsP to form an $N^+$ region 11 therein as shown in FIG. 8; a layer of nickel 12 is then electroless plated onto the $N^+$ region followed by electroless plating a layer of gold 18 to the nickel. Alternatively, the tin, gold, nickel and gold layers may be first deposited then all four alloyed together with a surface region of GaAsP to form the $N^+$ region 11 therein. Thereafter, the device is attached, N side down, to a post or header (not shown), a wire lead 14 bonded to the aluminum bonding pad 10*a*, e.g., as shown in FIGS. 7 and 8 and then encapsulated in a suitable lens (not shown) for LED's, e.g., clear epoxy. As with the GaP device described in Example 1, light from this GaAsP device is emitted through the P surface.

EXAMPLE 3

In still another embodiment of this invention, LED's are prepared with GaAs as the semiconductor component of the device.

Figure 9A:
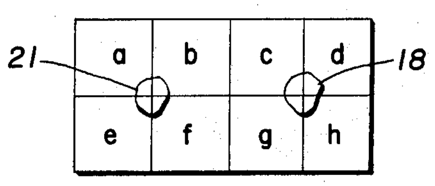
FIG. 9A is a top plan view showing a plurality of LED chips with metal contacts attached.
Figure 9B:
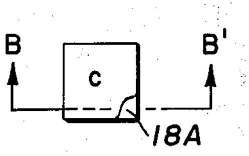
FIG. 9B representing the contact position on a single chip.
Figure 10:
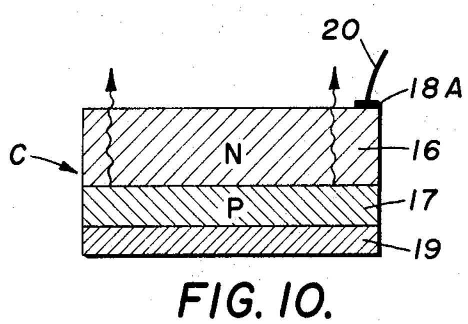
FIG. 10 is a cross-sectional schematic view taken along line B—B' of the LED shown in FIG. 9B.

In this example the GaAs semiconductor is of N-type conductivity doped with silicon to a carrier concentration of about $3.5\times10^{18}$ atoms/cc or, generally, within the range of about $1\times10^{17}$ to $5\times10^{18}$ atoms/cc. The fabrication process described in Example 2 is followed, except that the diffusion is conducted for about 7 hours and the P/N junction depth is about 15 microns. Also modified are the ohmic contacting procedures. Ohmic contact is first made to the N surface 16 in FIG. 10 by vacuum evaporation thereto of a Au/Ge alloy (12% Ge). In FIG. 9A is shown a plurality of GaAs dice, (LED chips) a-h, fabricated on a single wafer with the Au/Ge contacts 18 and 21 formed by photoresist and etching techniques well known to the art. The wafer is then scribed and cleaved into individual die, one of which is shown in FIG. 9B, showing die C in FIG. 9A. Next, the P surface contact is made by vacuum evaporating a layer of Au/Zn alloy 19 over the P surface 17. The wafer is then attached, P surface down to a header and a conductive lead wire 20, such as Au or Al, is bonded by thermocompression or ultra sonic bonding to bonding pad 18a as shown in FIG. 10. Light from this LED device is emitted through the N layers as depicted by the wavy arrows.

The preferred embodiments of the invention described herein are by way of illustration only, and not limitation. Other semiconductor materials in the III-V family of intermetallic compounds and mixtures or alloys thereof may be diffused according to the process of this invention as hereinabove described with reference to GaAs, GaP and GaAsP. The use of impurity oxides other than ZnO, e.g., CdO, in the same structural and functional relationship to the semiconductor is within the purview of this invention. These and other modifications of the invention will occur to those skilled in the art without departing from the spirit and scope thereof.

I claim:

1. Process for diffusing P-type impurities into N-type semiconductor body having the formula $GaAs_{1-X}P_X$, where X is a number from zero to one inclusive, which comprises:

a. providing a substrate of said semiconductor body;

b. depositing a layer of $SiO_2$ over the back surface of said substrate when it is GaAs or $GaAs_{1-X}P_X$ and another layer of $SiO_2$ over the front surface of said substrate;

c. heat treating the structure of step (b) when said substrate is GaAs or GaAsP;

d. depositing a layer of P-type impurity oxide onto said layer of $SiO_2$ deposited on the front surface of said substrate;

e. depositing a layer of $SiO_2$ onto said layer of impurity oxide and f. heating the structure of step (e) to diffuse impurities into said semiconductor substrate and form a region therein of P-type conductivity.

2. Process according to claim 1 wherein said impurity oxide is ZnO.

3. Process according to claim 2 wherein X in said formula equals one and semiconductor substrate is GaP and step (c) is omitted.

4. Process according to claim 2 wherein X in said formula equals zero and said semiconductor substrate is GaAs.

5. Process according to claim 2 wherein said semiconductor substrate is $GaAs_{1-X}P_X$, where X is a number greater than zero and less than one.

* * * * *